US012562211B2

(12) United States Patent　(10) Patent No.:　US 12,562,211 B2
Lin et al.　(45) Date of Patent:　Feb. 24, 2026

(54) POWER CONTROL CIRCUIT FOR MEMORY CIRCUIT BASED ON COMPLEMENTARY FIELD EFFECT TRANSISTOR DEVICES

(71) Applicant: TAIWAN SEMICONDUCTOR MANUFACTURING COMPANY, LTD., Hsinchu (TW)

(72) Inventors: Chien-Chen Lin, Hsinchu (TW); Shang Lin Wu, Hsinchu (TW); Yen Lin Chung, Hsinchu (TW); Chia-Che Chung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 118 days.

(21) Appl. No.: 18/455,876

(22) Filed: Aug. 25, 2023

(65) Prior Publication Data

US 2024/0321337 A1　Sep. 26, 2024

Related U.S. Application Data

(60) Provisional application No. 63/491,142, filed on Mar. 20, 2023.

(51) Int. Cl.
*G11C 11/4074*　(2006.01)
*G11C 5/14*　(2006.01)
*G11C 11/4094*　(2006.01)

(52) U.S. Cl.
CPC .......... *G11C 11/4074* (2013.01); *G11C 5/147* (2013.01); *G11C 11/4094* (2013.01)

(58) Field of Classification Search
CPC ............................ G11C 11/4074; G11C 5/147
See application file for complete search history.

(56) References Cited

U.S. PATENT DOCUMENTS 5,384,748 A * 1/1995 Sanemitsu ............ G11C 11/417
365/228
6,088,820 A * 7/2000 Jyo ........................ G11C 29/12
365/201
(Continued)

FOREIGN PATENT DOCUMENTS

CN　106133841　11/2016
CN　111834361 A　* 10/2020 ........... H01L 21/743
(Continued)

OTHER PUBLICATIONS

JP H1021699 A Translation (Year: 2025).*
CN 11834361 A Translation (Year: 2025).*

*Primary Examiner* — Khamdan N. Alrobaie
(74) *Attorney, Agent, or Firm* — Hauptman Ham, LLP

(57) ABSTRACT

An integrated circuit device includes a first transistor having a first-type channel and a second transistor having a second-type channel at a front side of a substrate. The first transistor is stacked over the second transistor. The integrated circuit device also includes a power line connected to a source terminal of the first transistor. The first transistor has a gate terminal configured to receive a control signal and has a drain terminal connected to both a gate terminal and a drain terminal of the second transistor. The integrated circuit device further includes a memory power line connected to a source terminal of the second transistor and a memory circuit configured to receive a supply voltage from the memory power line.

20 Claims, 13 Drawing Sheets

(56) References Cited

U.S. PATENT DOCUMENTS

| | | | | |
|---|---|---|---|---|
| 2010/0163868 A1* | 7/2010 | Yamazaki | ............ | H10D 86/441 |
| | | | | 257/E29.094 |
| 2021/0043630 A1* | 2/2021 | Liebmann | ............ | H10D 84/038 |
| 2021/0272624 A1* | 9/2021 | Gomes | ............... | H10D 30/6757 |
| 2021/0366906 A1* | 11/2021 | Huang | ............... | H01L 23/5286 |

FOREIGN PATENT DOCUMENTS

| | | | | | |
|---|---|---|---|---|---|
| JP | H1021699 A | * | 1/1998 | ............ | G11C 5/147 |
| TW | 202205288 | | 2/2022 | | |

* cited by examiner

CFET retention diode

400

20

VCC

TP1
controller

TP2

TP3

VCC_memory

40

Memory cell —— 50

CFET retention diode

BM0 track usage:

dP2/dP3 gP2/gP3 gP1 410 sP1

M0 track usage:

VLI VLI VG PG

VCC_memory

A BVD VD A' VCC

440

B MD/ MD/ B' MD
BMD BMD

VDR/BVDR 420

412 414 dP1/sP3 sP1

500

20

600

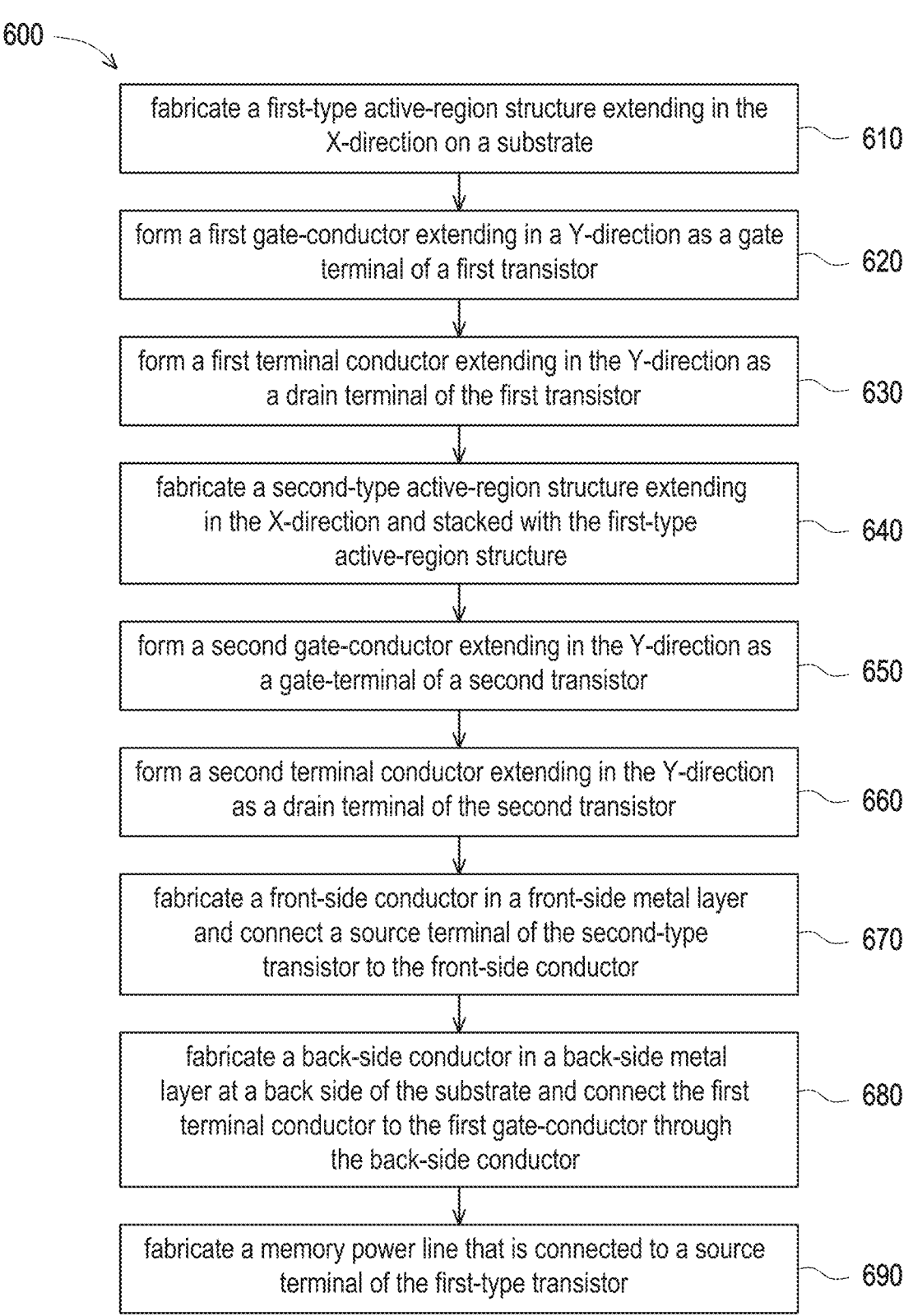

fabricate a first-type active-region structure extending in the X-direction on a substrate — 610 form a first gate-conductor extending in a Y-direction as a gate terminal of a first transistor — 620 form a first terminal conductor extending in the Y-direction as a drain terminal of the first transistor — 630 fabricate a second-type active-region structure extending in the X-direction and stacked with the first-type active-region structure — 640 form a second gate-conductor extending in the Y-direction as a gate-terminal of a second transistor — 650 form a second terminal conductor extending in the Y-direction as a drain terminal of the second transistor — 660 fabricate a front-side conductor in a front-side metal layer and connect a source terminal of the second-type transistor to the front-side conductor — 670 fabricate a back-side conductor in a back-side metal layer at a back side of the substrate and connect the first terminal conductor to the first gate-conductor through the back-side conductor — 680 fabricate a memory power line that is connected to a source terminal of the first-type transistor — 690

FIG. 6

POWER CONTROL CIRCUIT FOR MEMORY CIRCUIT BASED ON COMPLEMENTARY FIELD EFFECT TRANSISTOR DEVICES

PRIORITY CLAIM

The present application claims the priority of U.S. Provisional Application No. 63/491,142, filed Mar. 20, 2023, which is incorporated herein by reference in its entirety.

BACKGROUND

An integrated circuit (IC) typically includes a number of IC devices that are manufactured in accordance with one or more IC layout diagrams. IC devices sometimes include complementary field effect transistor (CFET) devices. A CFET device generally has an upper FET overlying a lower FET in a stacked configuration. Both the upper FET and the lower FET in a CFET device are positioned above the conductive lines in a back-side conductive layer but below the conductive lines in a front-side conductive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method of manufacturing an integrated circuit (IC) having CFET devices, in accordance with some embodiments.

DETAILED DESCRIPTION

Figure 1A:
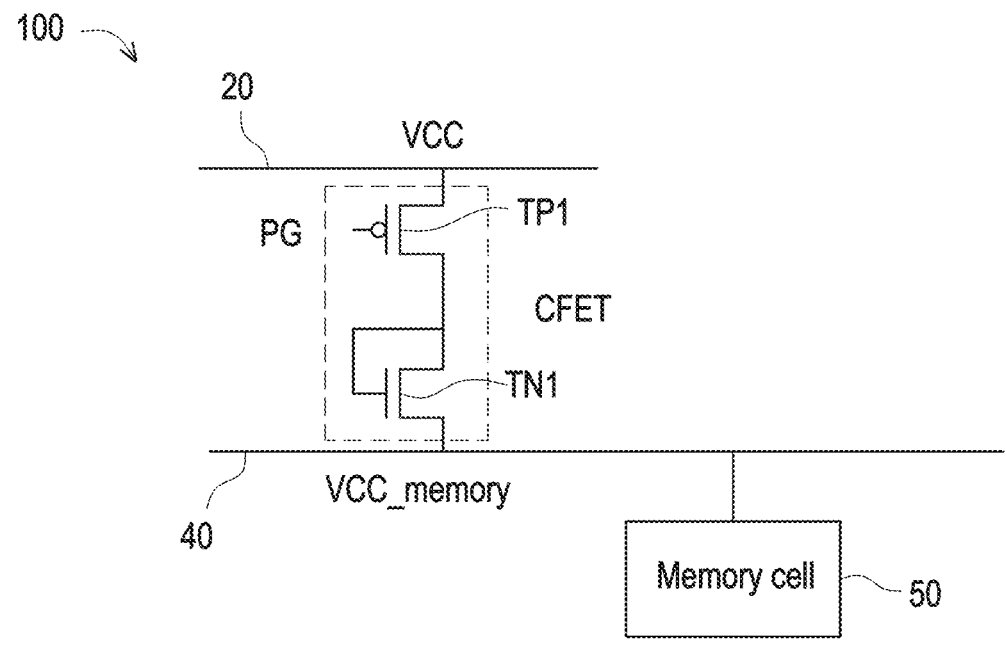
FIG. 1A is a schematic of a header switch implemented between a power line and a memory power line, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a header switch is implemented between a power line and a virtual power line which is connected to one or more memory cells. The header switch includes a CFET device having a first transistor stacked over a second transistor. As the gate terminal of the second transistor is connected to the drain terminal of the second transistor, the second transistor is configured to operate as a diode. The first transistor and the diode are serially connected. Consequently, the resistance ratio between the off-resistance (the header switch being in the non-conducting state) and the on-resistance (the header switch being in the conducting state) is improved while the chip area occupied by the header switch is reduced.

FIG. 1A is a schematic of a header switch 100 implemented between a power line 20 and a memory power line 40, in accordance with some embodiments. In some embodiments, the power line 20 is maintained at an upper power supply voltage VCC, and the memory power line 40 (which functions as a virtual power line) is connected to one or more memory cells. The header switch 100, as controlled with a power control signal PG, is either in a conducting state or in a non-conducting state. When the header switch 100 is in a conducting state, the memory power line 40 is connected to the power line 20, and consequently the upper power supply voltage VCC on the power line 20 is applied to the memory circuit 50. When the header switch 100 is in a non-conducting state, the power connection between the memory power line 40 and the power line 20 is cut off, and consequently the upper power supply voltage VCC on the power line 20 is prevented from being applied to the memory circuit 50. The header switch provides a power management scheme which enables the memory circuit 50 to receive the power based on an as-needed basis.

In FIG. 1A, the header switch 100 includes a PMOS transistor TP1 and an NMOS transistor TN1. The source terminal of the PMOS transistor TP1 is connected to the power line 20. The source terminal of the NMOS transistor TN1 is connected to the memory power line 40. The drain terminal of the PMOS transistor TP1 is connected to the drain terminal of the NMOS transistor TN1. The gate terminal of the PMOS transistor TP1 is configured to receive the power control signal PG. When the power control signal PG is at a logic LOW voltage level, the header switch 100 is set to the conducting state. When the power control signal PG is at a logic HIGH voltage level, the header switch 100 is set to the non-conducting state.

Figure 1B:
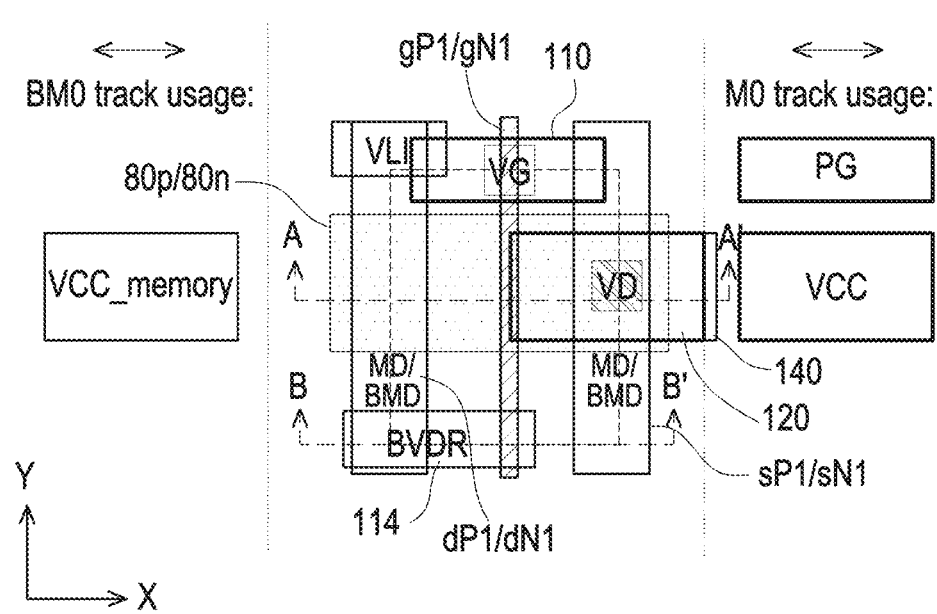
FIG. 1B is a layout diagram of the header switch in FIG. 1A, in accordance with some embodiments.
Figure 1C:
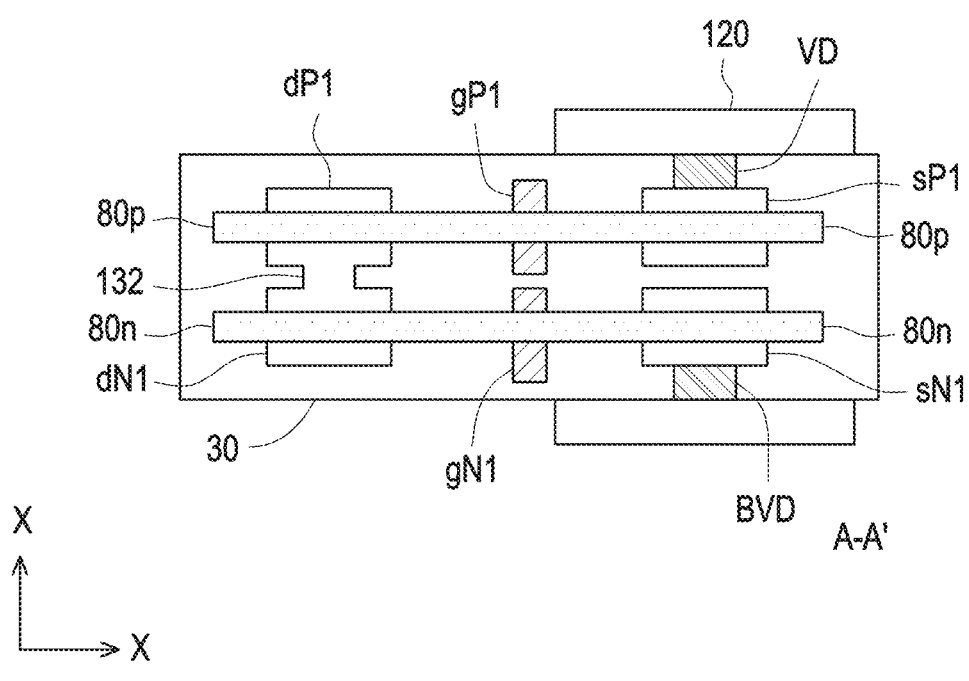
FIGS. 1C-1D are cross-sectional views of the header switch in the layout diagram of FIG. 1B, in accordance with some embodiments.
Figure 1D:
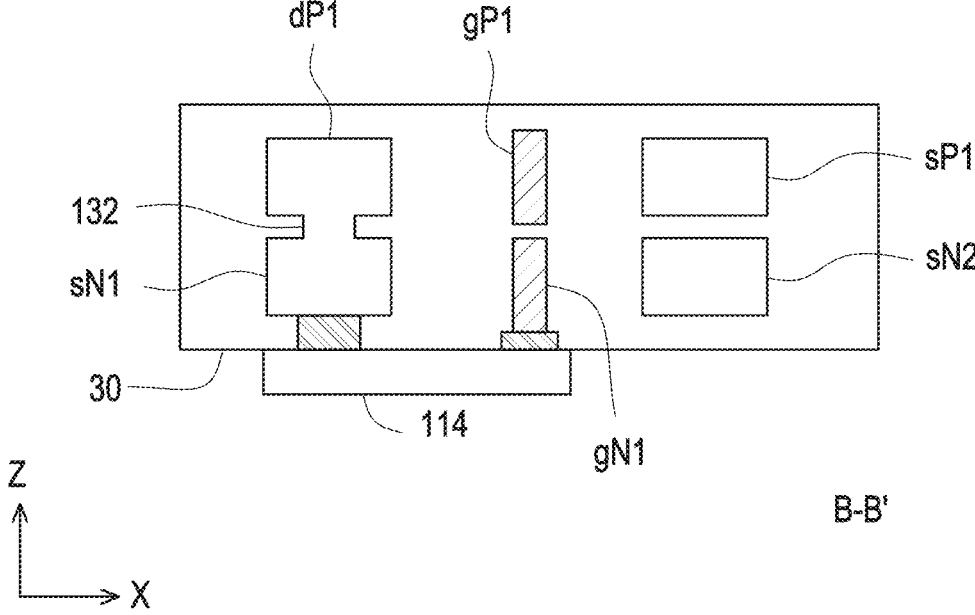

FIG. 1B is a layout diagram of the header switch 100 in FIG. 1A, in accordance with some embodiments. FIG. 1C is a cross-sectional view of the header switch 100 along a cutting plane A-A' as shown in the layout diagram of FIG. 1B, in accordance with some embodiments. FIG. 1D is a cross-sectional view of the header switch 100 along a cutting plane B-B' as shown in the layout diagram of FIG. 1B, in accordance with some embodiments.

The PMOS transistor TP1 and the NMOS transistor TN1 in the header switch 100 are correspondingly implemented with a PMOS active-region structure and an NMOS active-region structure. In FIGS. 1B-1D, each of the PMOS active-region structure 80*p* and the NMOS active-region structure 80*n* extends in the X-direction. The X-direction, the Y-direction, and the Z-direction in FIGS. 1B-1D are mutually perpendicular to each other and form an orthogonal coordinate frame. The PMOS active-region structure 80*p* is stacked over the NMOS active-region structure 80*n* and shifted from the NMOS active-region structure 80*n* along the Z-direction. Each of the PMOS active-region structure 80*p* and the NMOS active-region structure 80*n* is at the front side of a substrate 30. A gate-conductor gP1 extending in the Y-direction intersects the PMOS active-region structure 80*p* at the channel region of the PMOS transistor TP1. A gate-conductor gN1 extending in the Y-direction intersects the NMOS active-region structure 80*n* at the channel region of the NMOS transistor TN1.

In some embodiments, each of the PMOS active-region structure 80*p* and the NMOS active-region structure 80*n* includes one or more nano-sheets, and consequently, each of the PMOS transistor TP1 and the NMOS transistor TN1 is a nano-sheet transistor. In some embodiments, each of the PMOS active-region structure 80*p* and the NMOS active-region structure 80*n* includes one or more nano-wires, and consequently, each of the PMOS transistor TP1 and the NMOS transistor TN1 is a nano-wire transistor.

In FIGS. 1B-1D, the terminal conductor MD intersecting the PMOS active-region structure 80*p* at the source region of the PMOS transistor TP1 forms the source terminal sP1 of the PMOS transistor TP1, and the terminal conductor MD intersecting the PMOS active-region structure 80*p* at the drain region of the PMOS transistor TP1 forms the drain terminal dP1 of the PMOS transistor TP1. The terminal conductor BMD intersecting the NMOS active-region structure 80*n* at the source region of the NMOS transistor TN1 forms the source terminal sN1 of the NMOS transistor TN1, and the terminal conductor BMD intersecting the NMOS active-region structure 80*n* at the drain region of the NMOS transistor TN1 forms the drain terminal dN1 of the NMOS transistor TN1.

The source terminal sP1 of the PMOS transistor TP1 is connected to a front-side conductor 120 in a first front-side metal layer through a via-connector VD. The source terminal sN1 of the NMOS transistor TN1 is connected to a back-side conductor 140 in a first back-side metal layer through a via-connector BVD. The drain terminal dP1 of the PMOS transistor TP1 is connected to the drain terminal dN1 of the NMOS transistor TN1 through an inter-terminal connector 132. The gate terminal gN1 of the NMOS transistor TN1 and the drain terminal dN1 of the NMOS transistor TN1 are conductively connected together through a back-side conductor 114 in the first back-side metal layer.

The gate terminal gP1 of the PMOS transistor TP1 is connected to a front-side conductor 110 in the first front-side metal layer through a via-connector VG. The front-side conductor 110 is configured to receive the power control signal PG. The front-side conductor 120 is configured to receive the upper power supply voltage VCC. The back-side conductor 140 is configured as the memory power line 40 which is connected to the memory circuit 50.

Figure 2A:
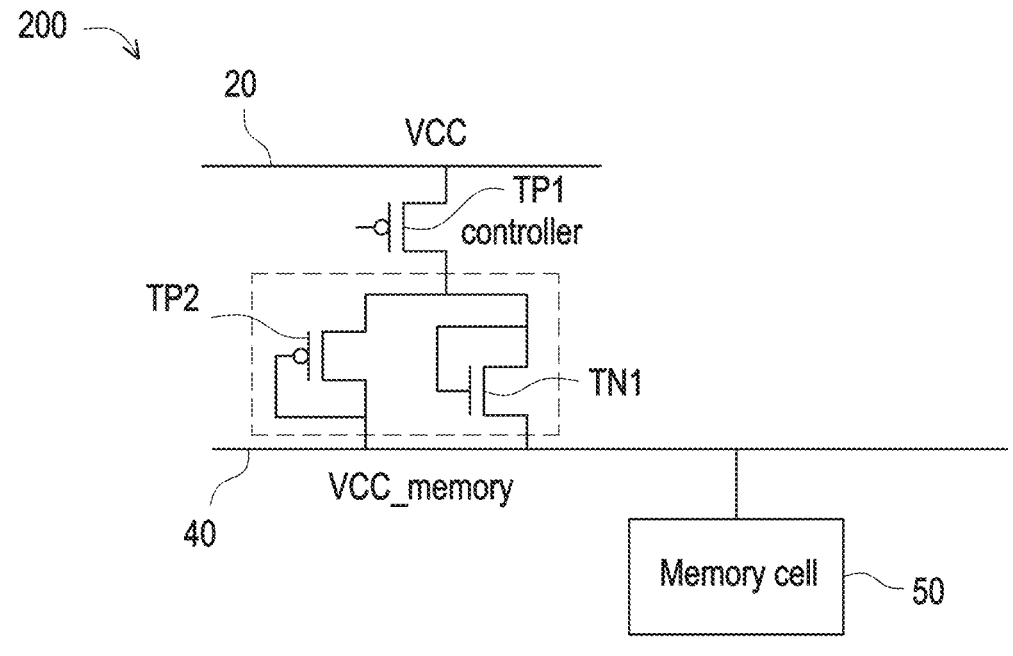
FIG. 2A is a schematic of a header switch implemented between a power line and a memory power line, in accordance with some embodiments.

Other embodiments of the header switch between a power line 20 and a memory power line 40 are described with reference to FIGS. 2A-2D. FIG. 2A is a schematic of a header switch 200 implemented between a power line 20 and a memory power line 40, in accordance with some embodiments.

In FIG. 2A, the header switch 200 includes two PMOS transistors TP1 and TP2 and one NMOS transistor TN1. The source terminal of the PMOS transistor TP1 is connected to the power line 20. The source terminal of the NMOS transistor TN1 and the drain terminal of the PMOS transistor TP2 are connected to the memory power line 40. The drain terminal of the NMOS transistor TN1 and the source terminal of the PMOS transistor TP2 are connected to the drain terminal of the PMOS transistor TP1. The gate terminal of the PMOS transistor TP2 is connected to the drain terminal of the PMOS transistor TP2. The gate terminal of the NMOS transistor TN1 is connected to the drain terminal of the NMOS transistor TN1. The gate terminal of the PMOS transistor TP1 is configured to receive the power control signal PG. When the power control signal PG is at a logic LOW voltage level, the header switch 200 is set to the conducting state. When the power control signal PG is at a logic HIGH voltage level, the header switch 200 is set to the non-conducting state.

Figure 2B:
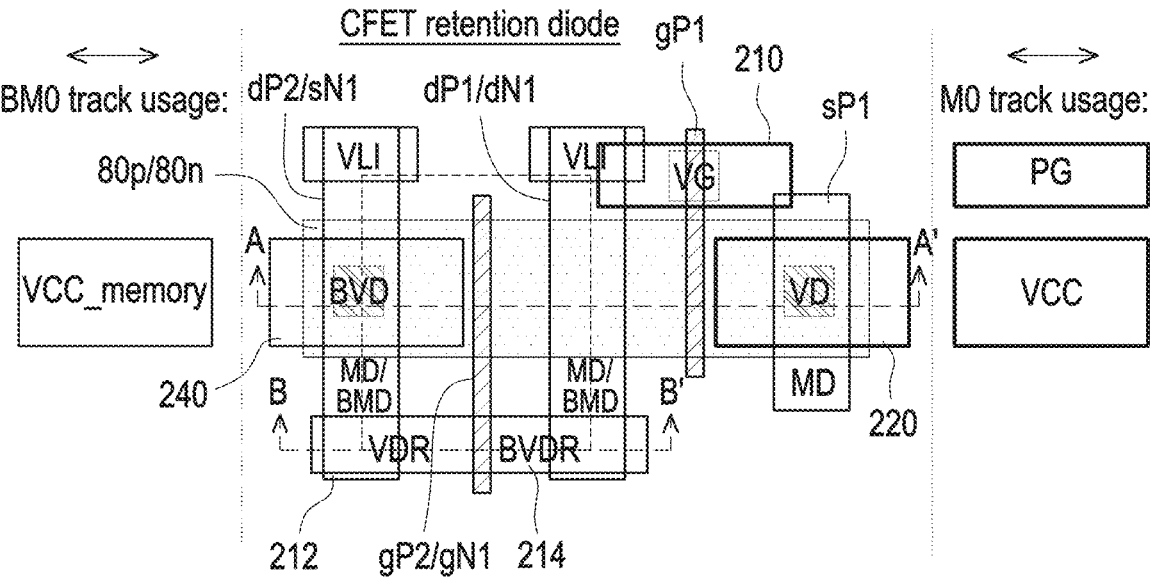
FIG. 2B is a layout diagram of the header switch in FIG. 2A, in accordance with some embodiments.
Figure 2C:
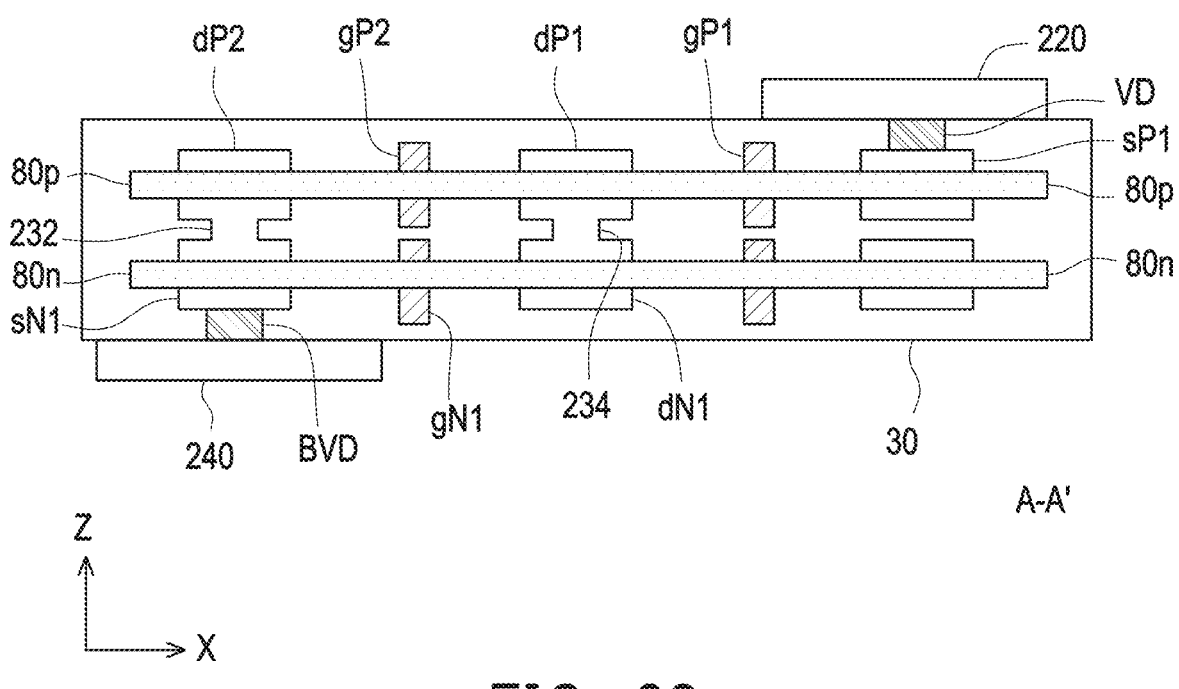
FIGS. 2C-2D are cross-sectional views of the header switch in the layout diagram of FIG. 2B, in accordance with some embodiments.
Figure 2D:
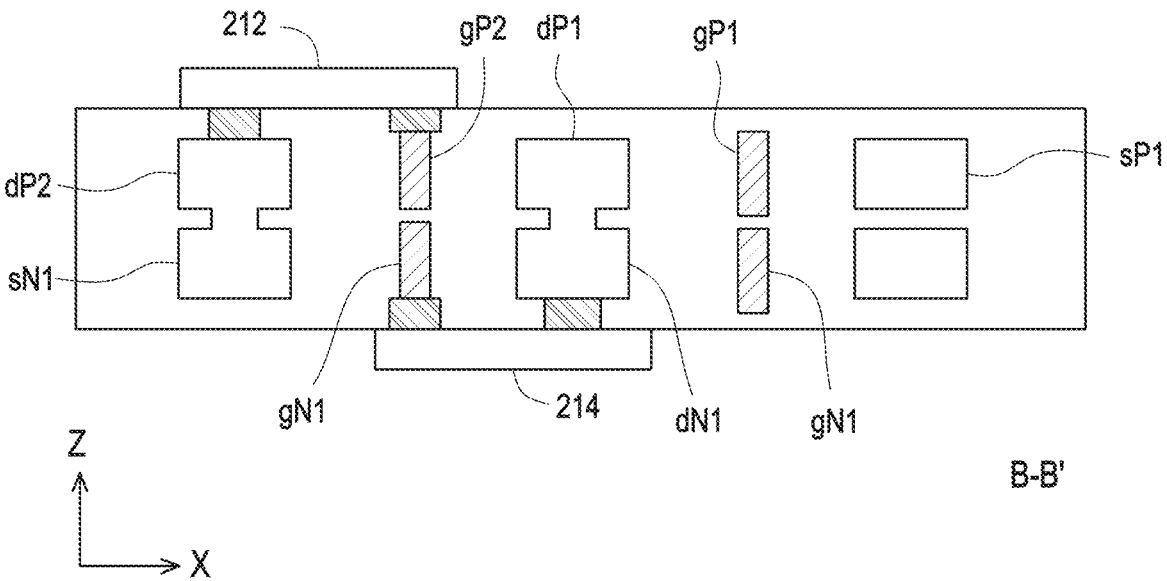

FIG. 2B is a layout diagram of the header switch 200 in FIG. 2A, in accordance with some embodiments. FIG. 2C is a cross-sectional view of the header switch 200 along a cutting plane A-A' as shown in the layout diagram of FIG. 2B, in accordance with some embodiments. FIG. 2D is a cross-sectional view of the header switch 200 along a cutting plane B-B' as shown in the layout diagram of FIG. 2B, in accordance with some embodiments.

The PMOS transistors TP1 and TP2 in the header switch 200 are implemented with a PMOS active-region structure. The NMOS transistor TN1 in the header switch 200 is implemented with an NMOS active-region structure. In FIGS. 2B-2D, each of the PMOS active-region structure 80*p*
and the NMOS active-region structure 80*n* extends in the
X-direction. The X-direction, the Y-direction, and the Z-di-
rection in FIGS. 2B-2D are mutually perpendicular to each
other and form an orthogonal coordinate frame. The PMOS
active-region structure 80*p* is stacked over the NMOS
active-region structure 80*n* and shifted from the NMOS
active-region structure 80*n* along the Z-direction. Each of
the PMOS active-region structure 80*p* and the NMOS
active-region structure 80*n* is at the front side of a substrate
30. A gate-conductor gP1 extending in the Y-direction
intersects the PMOS active-region structure 80*p* at the
channel region of the PMOS transistor TP1. A gate-conduc-
tor gP2 extending in the Y-direction intersects the PMOS
active-region structure 80*p* at the channel region of the
PMOS transistor TP2. A gate-conductor gN1 extending in
the Y-direction intersects the NMOS active-region structure
80*n* at the channel region of the NMOS transistor TN1. In
some embodiments, the PMOS transistors TP1 and TP2 and
the NMOS transistor TN1 are nano-sheet transistors. In
some embodiments, the PMOS transistors TP1 and TP2 and
the NMOS transistor TN1 are nano-wire transistors.

In FIGS. 2B-2D, the terminal conductor MD intersecting
the PMOS active-region structure 80*p* at the source region of
the PMOS transistor TP1 forms the source terminal sP1 of
the PMOS transistor TP1, and the terminal conductor MD
intersecting the PMOS active-region structure 80*p* at the
drain region of the PMOS transistor TP1 forms the drain
terminal dP1 of the PMOS transistor TP1. The terminal
conductor MD intersecting the PMOS active-region struc-
ture 80*p* at the drain region of the PMOS transistor TP2
forms the drain terminal dP2 of the PMOS transistor TP2.
The terminal conductor BMD intersecting the NMOS
active-region structure 80*n* at the source region of the
NMOS transistor TN1 forms the source terminal sN1 of the
NMOS transistor TN1, and the terminal conductor BMD
intersecting the NMOS active-region structure 80*n* at the
drain region of the NMOS transistor TN1 forms the drain
terminal dN1 of the NMOS transistor TN1.

The source terminal sP1 of the PMOS transistor TP1 is
connected to a front-side conductor 220 in a first front-side
metal layer through a via-connector VD. The source termi-
nal sN1 of the NMOS transistor TN1 is connected to a
back-side conductor 240 in a first back-side metal layer
through a via-connector BVD. The drain terminal dP1 of the
PMOS transistor TP1 is connected to the drain terminal dN1
of the NMOS transistor TN1 through an inter-terminal
connector 234. The drain terminal dP1 of the PMOS tran-
sistor TP1 is joined with the source terminal of the PMOS
transistor TP2 in the PMOS active-region structure 80*p*. The
drain terminal dP2 of the PMOS transistor TP2 is connected
to the source terminal sN1 of the NMOS transistor TN1
through an inter-terminal connector 232. The gate terminal
gN1 of the NMOS transistor TN1 and the drain terminal dN1
of the NMOS transistor TN1 are conductively connected
together through a back-side conductor 214 in the first
back-side metal layer. The gate terminal gP2 of the PMOS
transistor TP2 and the drain terminal dP2 of the PMOS
transistor TP2 are conductively connected together through
a front-side conductor 212 in the first front-side metal layer.

The gate terminal of the PMOS transistor TP1 is con-
nected to a front-side conductor 210 in the first front-side
metal layer through a via-connector VG. The front-side
conductor 210 is configured to receive the power control
signal PG. The front-side conductor 220 is configured to
receive the upper power supply voltage VCC. The back-side conductor 240 is configured as the memory power line 40
which is connected to the memory circuit 50.

In the embodiments as shown in FIGS. 2A-2D, the PMOS
active-region structure 80*p* is stacked above the NMOS
active-region structure 80*n* on a substrate. In FIGS. 2A-2D,
the NMOS active-region structure 80*n* is between the PMOS
active-region structure 80*p* and the first back-side metal
layer (which contains the back-side conductor 240), and the
PMOS active-region structure 80*p* is between the first front-
side metal layer (which contains the front-side conductor
220) and the NMOS active-region structure 80*n*. In some
other embodiments as shown in FIGS. 3A-3D, the NMOS
active-region structure 80*n* is stacked above the PMOS
active-region structure 80*p* on a substrate. In FIGS. 3A-3D,
the PMOS active-region structure 80*p* is between the NMOS
active-region structure 80*n* and the first back-side metal
layer, and the NMOS active-region structure 80*n* is between
the first front-side metal layer and the PMOS active-region
structure 80*p*.

Figure 3A:
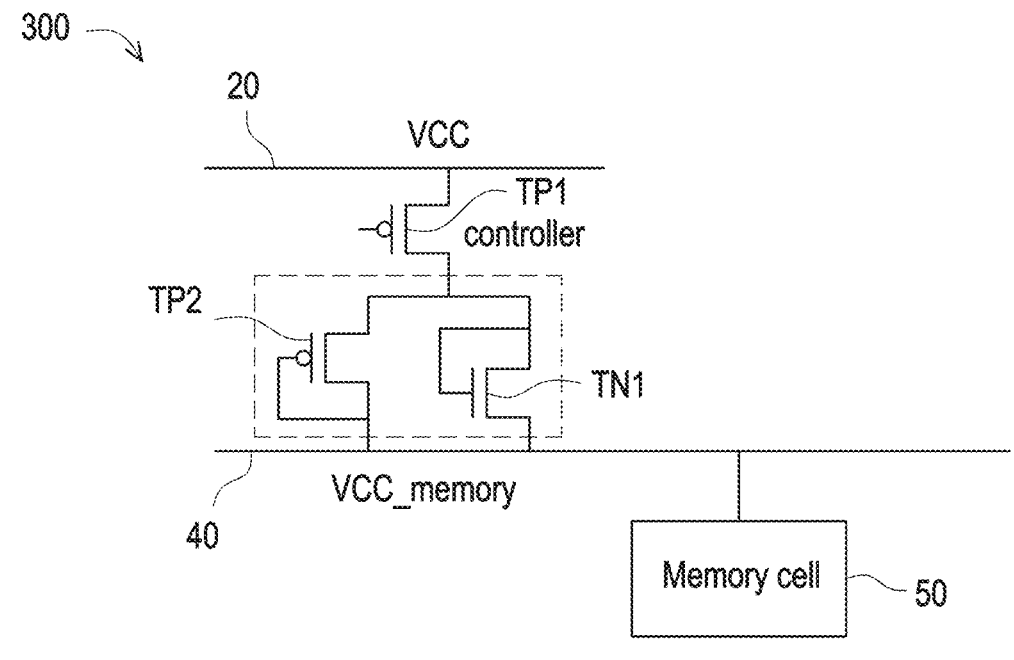
FIG. 3A is a schematic of a header switch implemented between a power line and a memory power line, in accordance with some embodiments.

FIG. 3A is a schematic of a header switch 300 imple-
mented between a power line 20 and a memory power line
40, in accordance with some embodiments. The header
switch 300 in FIG. 3A and the header switch 200 in FIG. 2A
have the same circuit diagram. The header switch 300 in
FIG. 3A and the header switch 200 in FIG. 2A are imple-
mented with different stack arrangements of the PMOS
active-region structure and the NMOS active-region struc-
ture.

Figure 3B:
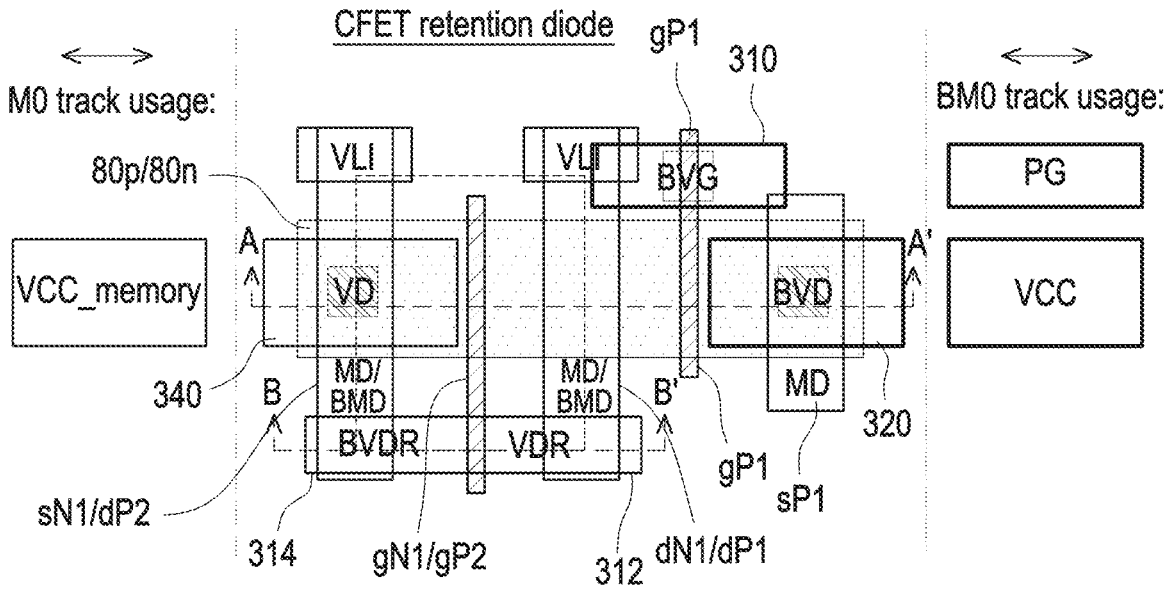
FIG. 3B is a layout diagram of the header switch in FIG. 3A, in accordance with some embodiments.
Figure 3C:
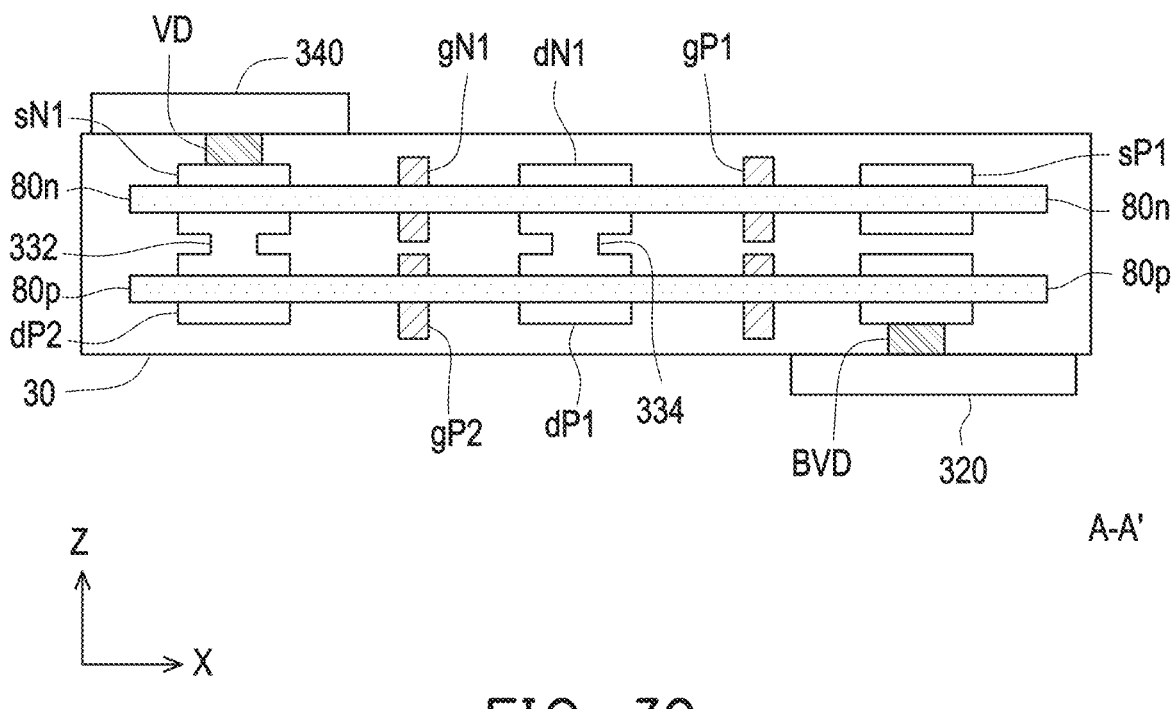
FIGS. 3C-3D are cross-sectional views of the header switch in the layout diagram of FIG. 3B, in accordance with some embodiments.
Figure 3D:
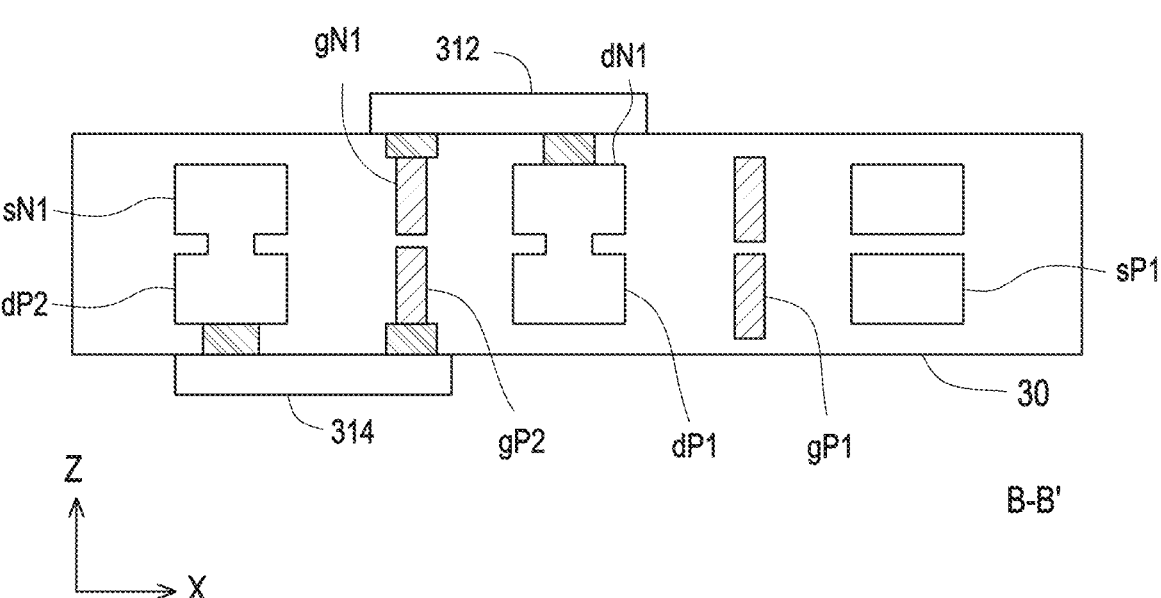

FIG. 3B is a layout diagram of the header switch 300 in
FIG. 3A, in accordance with some embodiments. FIG. 3C is
a cross-sectional view of the header switch 300 along a
cutting plane A-A' as shown in the layout diagram of FIG.
3B, in accordance with some embodiments. FIG. 3D is a
cross-sectional view of the header switch 300 along a cutting
plane B-B' as shown in the layout diagram of FIG. 3B, in
accordance with some embodiments.

In FIGS. 3B-3D, the source terminals and drain terminals
of various transistors are formed with the terminal conduc-
tors intersecting the PMOS active-region structure or the
NMOS active-region structure, which are similar to the
implementations of the source terminals and drain terminals
in FIGS. 2B-2D. In FIGS. 3B-3D, the terminal conductor
BMD intersecting the PMOS active-region structure 80*p* at
the source region of the PMOS transistor TP1 forms the
source terminal sP1 of the PMOS transistor TP1, and the
terminal conductor BMD intersecting the PMOS active-
region structure 80*p* at the drain region of the PMOS
transistor TP1 forms the drain terminal dP1 of the PMOS
transistor TP1. The terminal conductor BMD intersecting
the PMOS active-region structure 80*p* at the drain region of
the PMOS transistor TP2 forms the drain terminal dP2 of the
PMOS transistor TP2. The terminal conductor MD inter-
secting the NMOS active-region structure 80*n* at the source
region of the NMOS transistor TN1 forms the source ter-
minal sN1 of the NMOS transistor TN1, and the terminal
conductor MD intersecting the NMOS active-region struc-
ture 80*n* at the drain region of the NMOS transistor TN1
forms the drain terminal dN1 of the NMOS transistor TN1.

In FIGS. 3B-3D; however, the conductive connections
from various terminals of the transistors to the front-side
conductors or to the back-side conductors are modified from
the conductive connections in FIGS. 2B-2D. In FIGS.
3B-3D, the source terminal sP1 of the PMOS transistor TP1
is connected to a back-side conductor 320 in a first back-side
metal layer through a via-connector BVD. The source ter-
minal sN1 of the NMOS transistor TN1 is connected to a
front-side conductor 340 in a first front-side metal layer through a via-connector VD. The drain terminal dP1 of the PMOS transistor TP1 is connected to the drain terminal dN1 of the NMOS transistor TN1 through an inter-terminal connector 334. The drain terminal dP1 of the PMOS transistor TP1 is joined with the source terminal of the PMOS transistor TP2 in the PMOS active-region structure 80p. The drain terminal dP2 of the PMOS transistor TP2 is connected to the source terminal sN1 of the NMOS transistor TN1 through an inter-terminal connector 332. The gate terminal gN1 of the NMOS transistor TN1 and the drain terminal dN1 of the NMOS transistor TN1 are conductively connected together through a front-side conductor 312 in the first front-side metal layer. The gate terminal gP2 of the PMOS transistor TP2 and the drain terminal dP2 of the PMOS transistor TP2 are conductively connected together through a back-side conductor 314 in the first back-side metal layer.

The gate terminal of the PMOS transistor TP1 is connected to a back-side conductor 310 in the first back-side metal layer through a via-connector BVG. The back-side conductor 310 is configured to receive the power control signal PG. The back-side conductor 320 is configured to receive the upper power supply voltage VCC. The front-side conductor 340 is configured as the memory power line 40 which is connected to the memory circuit 50.

In the embodiments as shown in FIGS. 2A-2D, the header switch 200 includes two PMOS transistors TP1 and TP2 and one NMOS transistor TN1. In some alternative embodiments as shown in FIGS. 4A-4D, the header switch 400 includes three PMOS transistors TP1, TP2, and TP3.

Figure 4A:
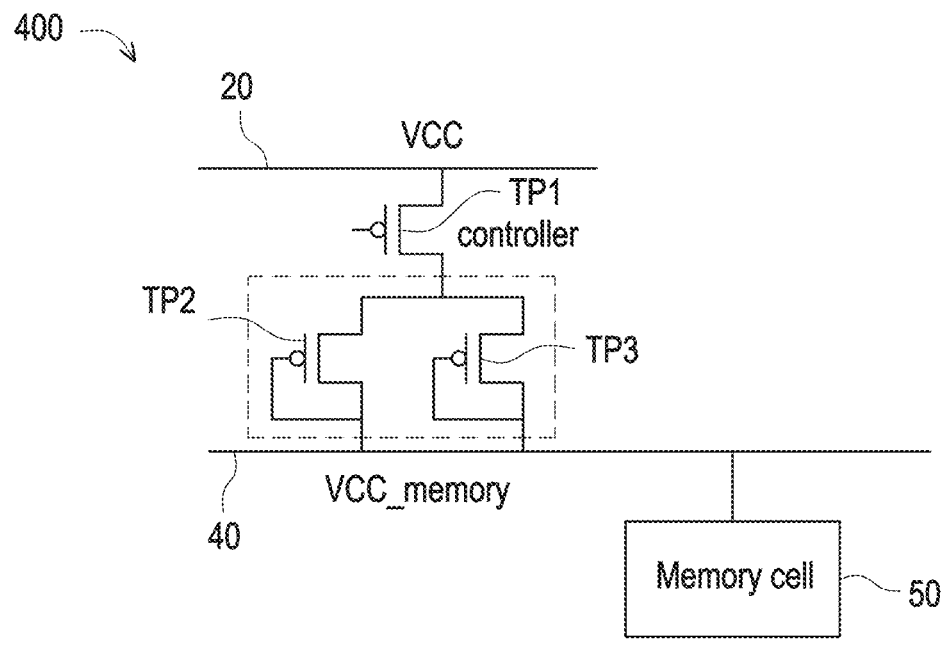
FIG. 4A is a schematic of a header switch implemented between a power line and a memory power line, in accordance with some embodiments.

FIG. 4A is a schematic of a header switch 400 implemented between a power line 20 and a memory power line 40, in accordance with some embodiments. In FIG. 4A, the source terminal of the PMOS transistor TP1 is connected to the power line 20. The drain terminals of the PMOS transistors TP2 and TP3 are connected to the memory power line 40. The source terminals of the PMOS transistors TP2 and TP3 are connected to the drain terminal of the PMOS transistor TP1. The gate terminals of the PMOS transistors TP2 and TP3 are connected to the memory power line 40. The gate terminal of the PMOS transistor TP1 is configured to receive the power control signal PG. When the power control signal PG is at a logic LOW voltage level, the header switch 400 is set to the conducting state. When the power control signal PG is at a logic HIGH voltage level, the header switch 400 is set to the non-conducting state.

Figure 4B:
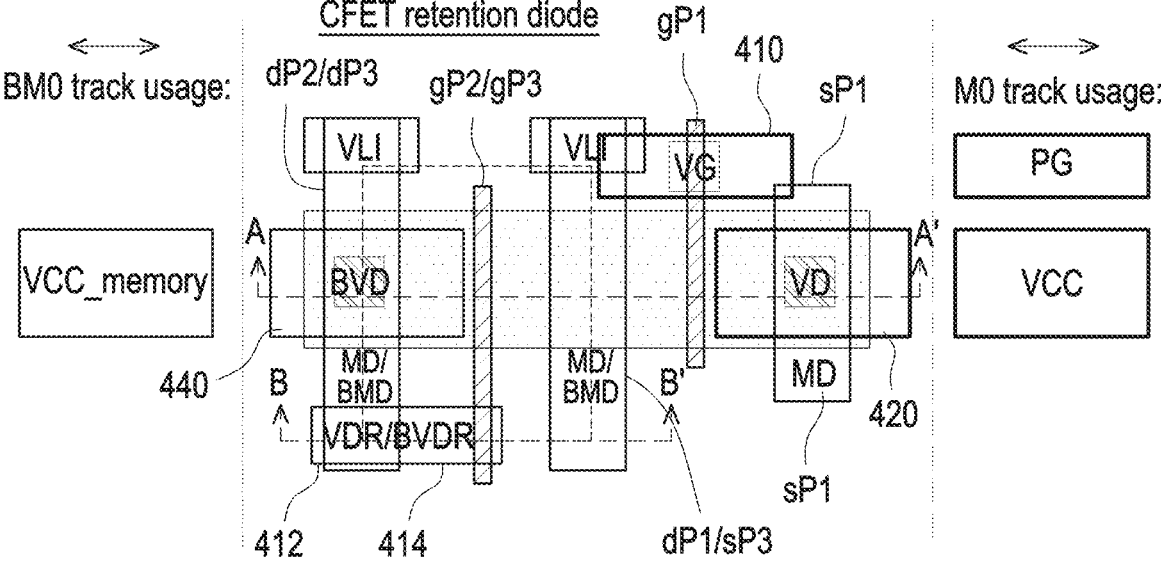
FIG. 4B is a layout diagram of the header switch in FIG. 4A, in accordance with some embodiments.
Figure 4C:
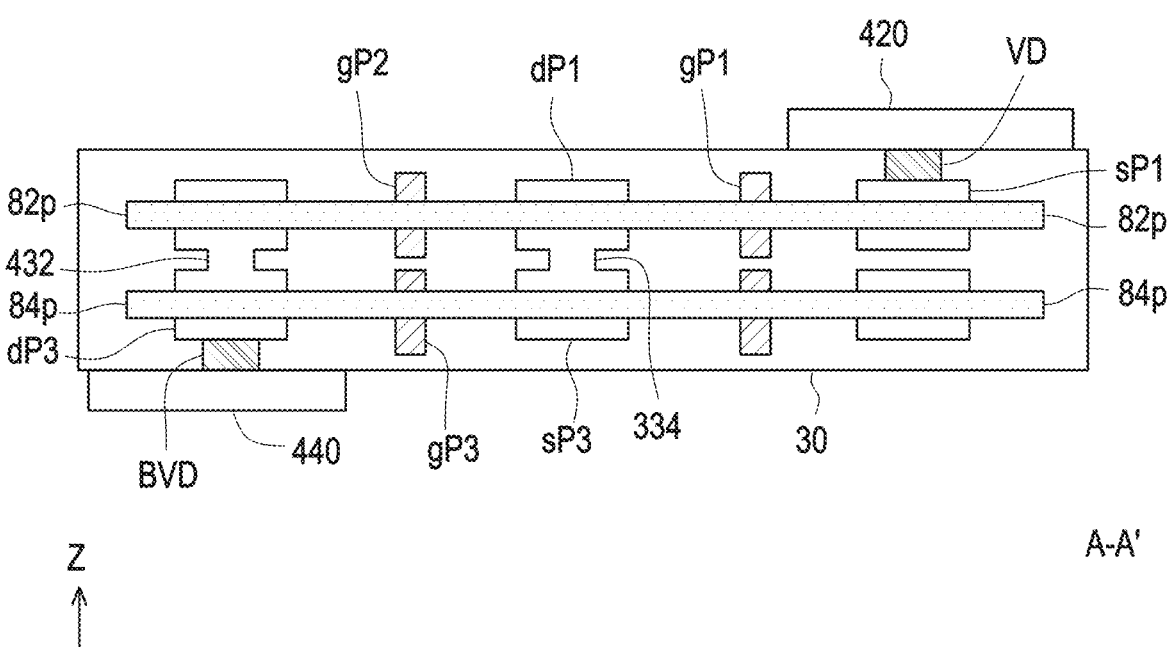
FIGS. 4C-4D are cross-sectional views of the header switch in the layout diagram of FIG. 4B, in accordance with some embodiments.
Figure 4D:
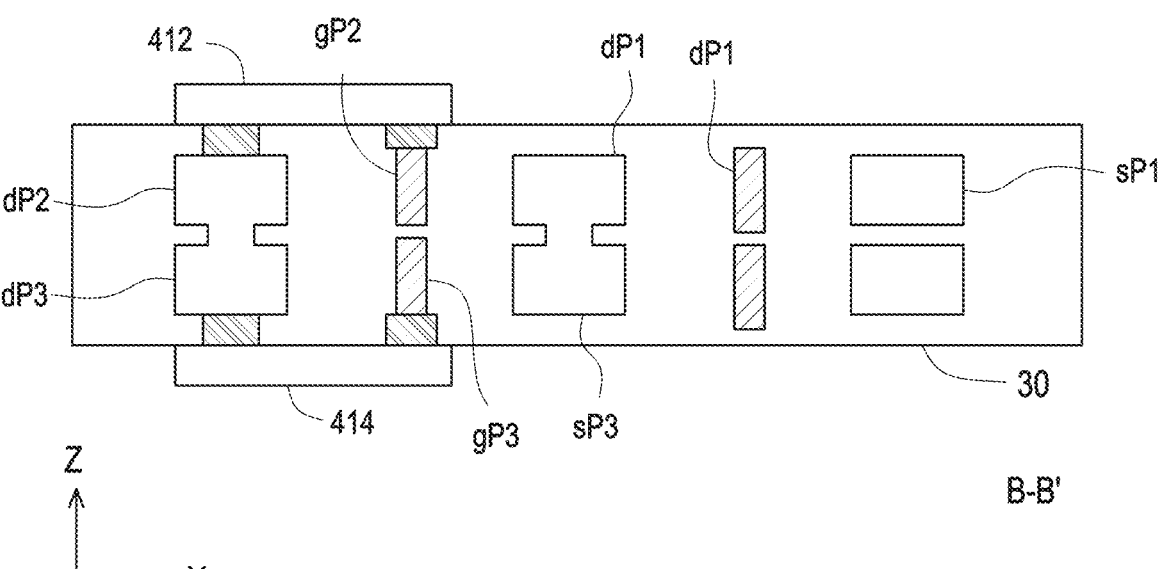

FIG. 4B is a layout diagram of the header switch 400 in FIG. 4A, in accordance with some embodiments. FIG. 4C is a cross-sectional view of the header switch 400 along a cutting plane A-A' as shown in the layout diagram of FIG. 4B, in accordance with some embodiments. FIG. 4D is a cross-sectional view of the header switch 400 along a cutting plane B-B' as shown in the layout diagram of FIG. 4B, in accordance with some embodiments.

In FIGS. 4B-4D, the PMOS transistors TP1 and TP2 in the header switch 400 are implemented with a PMOS active-region structure 82p. The PMOS transistor TP3 in the header switch 400 is implemented with a PMOS active-region structure 84p. Each of the PMOS active-region structure 82p and the PMOS active-region structure 84p extends in the X-direction. The PMOS active-region structure 82p is stacked over the PMOS active-region structure 84p and shifted from the PMOS active-region structure 84p along the Z-direction. Each of the PMOS active-region structures 82p and 84p is at the front side of a substrate 30. A gate-conductor gP1 extending in the Y-direction intersects the PMOS active-region structure 82p at the channel region of the PMOS transistor TP1. A gate-conductor gP2 extending in the Y-direction intersects the PMOS active-region structure 82p at the channel region of the PMOS transistor TP2. A gate-conductor gP3 extending in the Y-direction intersects the PMOS active-region structure 84p at the channel region of the PMOS transistor TP3. In some embodiments, the PMOS transistors TP1, TP2, and TP3 are nano-sheet transistors. In some embodiments, the PMOS transistors TP1, TP2, and TP3 are nano-wire transistors.

In FIGS. 4B-4D, the terminal conductor MD intersecting the PMOS active-region structure 82p at the source region of the PMOS transistor TP1 forms the source terminal sP1 of the PMOS transistor TP1, and the terminal conductor MD intersecting the PMOS active-region structure 82p at the drain region of the PMOS transistor TP1 forms the drain terminal dP1 of the PMOS transistor TP1. The terminal conductor MD intersecting the PMOS active-region structure 80p at the drain region of the PMOS transistor TP2 forms the drain terminal dP2 of the PMOS transistor TP2. The terminal conductor BMD intersecting the PMOS active-region structure 84p at the source region of the PMOS transistor TP3 forms the source terminal sP3 of the PMOS transistor TP3, and the terminal conductor BMD intersecting the PMOS active-region structure 84p at the drain region of the PMOS transistor TP3 forms the drain terminal dP3 of the PMOS transistor TP3.

The source terminal sP1 of the PMOS transistor TP1 is connected to a front-side conductor 420 in a first front-side metal layer through a via-connector VD. The drain terminal dP3 of the PMOS transistor TP3 is connected to a back-side conductor 440 in a first back-side metal layer through a via-connector BVD. The drain terminal dP1 of the PMOS transistor TP1 is connected to the source terminal sP3 of the PMOS transistor TP3 through an inter-terminal connector 434. The drain terminal dP1 of the PMOS transistor TP1 is joined with the source terminal of the PMOS transistor TP2 in the PMOS active-region structure 82p. The drain terminal dP2 of the PMOS transistor TP2 is connected to the drain terminal dP3 of the PMOS transistor TP3 through an inter-terminal connector 432. The gate terminal gP2 of the PMOS transistor TP2 and the drain terminal dP2 of the PMOS transistor TP2 are conductively connected together through a front-side conductor 412 in the first front-side metal layer. The gate terminal gP3 of the PMOS transistor TP3 and the drain terminal dP3 of the PMOS transistor TP3 are conductively connected together through a back-side conductor 414 in the first back-side metal layer.

The gate terminal of the PMOS transistor TP1 is connected to a front-side conductor 410 in the first front-side metal layer through a via-connector VG. The front-side conductor 410 is configured to receive the power control signal PG. The front-side conductor 420 is configured to receive the upper power supply voltage VCC. The back-side conductor 440 is configured as the memory power line 40 which is connected to the memory circuit 50.

In the embodiments as shown in FIGS. 2A-2D, the header switch 200 includes two PMOS transistors TP1 and TP2 and one NMOS transistor TN1. In some alternative embodiments as shown in FIGS. 5A-5D, the header switch 500 includes one PMOS transistor TP1 and two NMOS transistors TN1 and TN2.

Figure 5A:
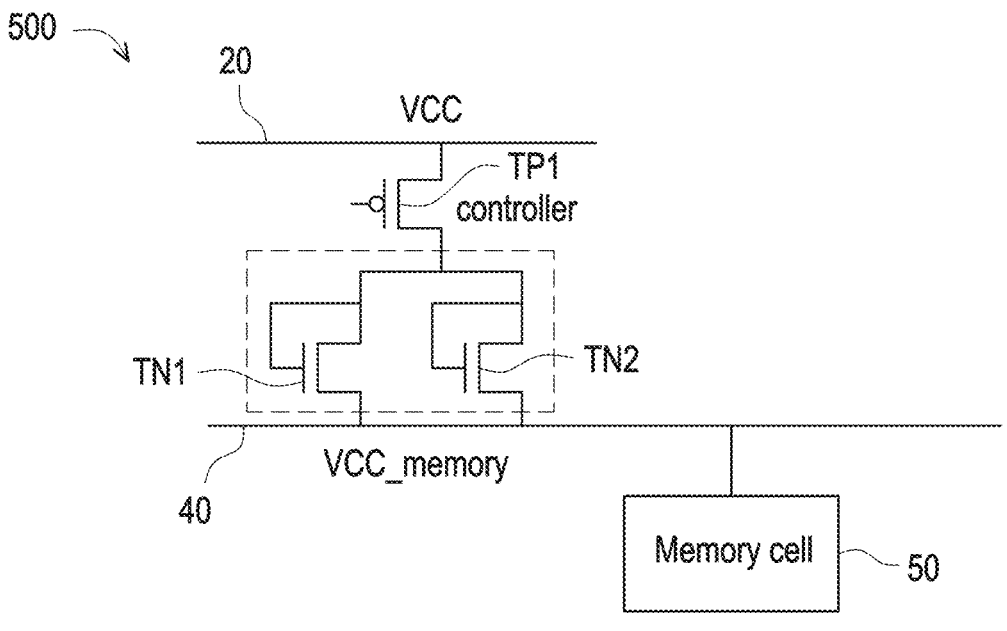
FIG. 5A is a schematic of a header switch implemented between a power line and a memory power line, in accordance with some embodiments.

FIG. 5A is a schematic of a header switch 500 implemented between a power line 20 and a memory power line 40, in accordance with some embodiments. In FIG. 5A, the source terminal of the PMOS transistor TP1 is connected to the power line 20. The source terminals of the NMOS transistors TN2 and TN3 are connected to the memory power line 40. The drain terminals of the NMOS transistors TN2 and TN3 are connected to the drain terminal of the PMOS transistor TP1. The gate terminals of the NMOS transistors TN2 and TN3 are also connected to the drain terminal of the PMOS transistor TP1. The gate terminal of the PMOS transistor TP1 is configured to receive the power control signal PG. When the power control signal PG is at a logic LOW voltage level, the header switch 500 is set to the conducting state. When the power control signal PG is at a logic HIGH voltage level, the header switch 500 is set to the non-conducting state.

Figure 5B:
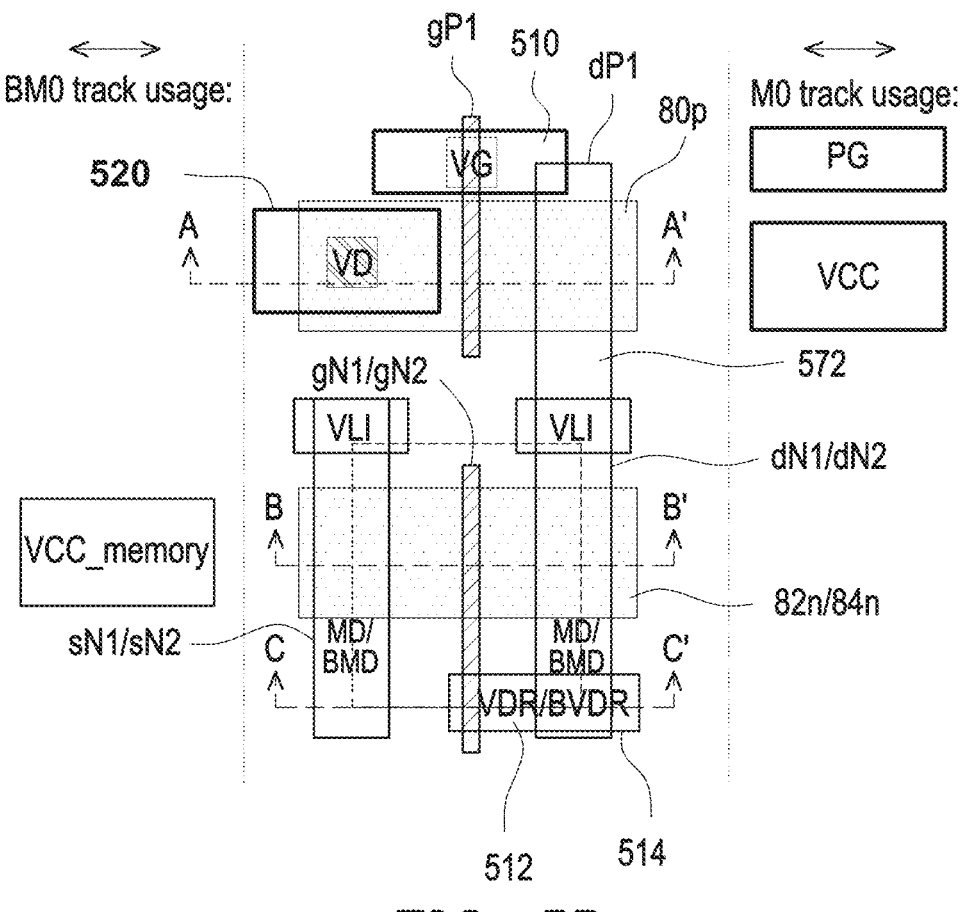
FIG. 5B is a layout diagram of the header switch in FIG. 5A, in accordance with some embodiments.
Figure 5C:
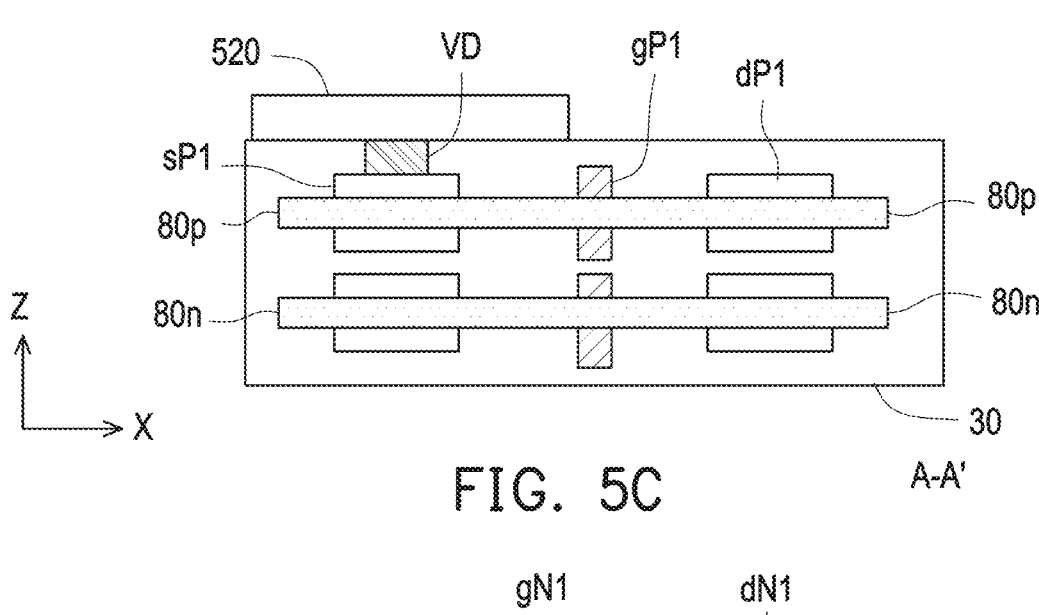
FIGS. 5C-5E are cross-sectional views of the header switch in the layout diagram of FIG. 5B, in accordance with some embodiments.
Figure 5D:
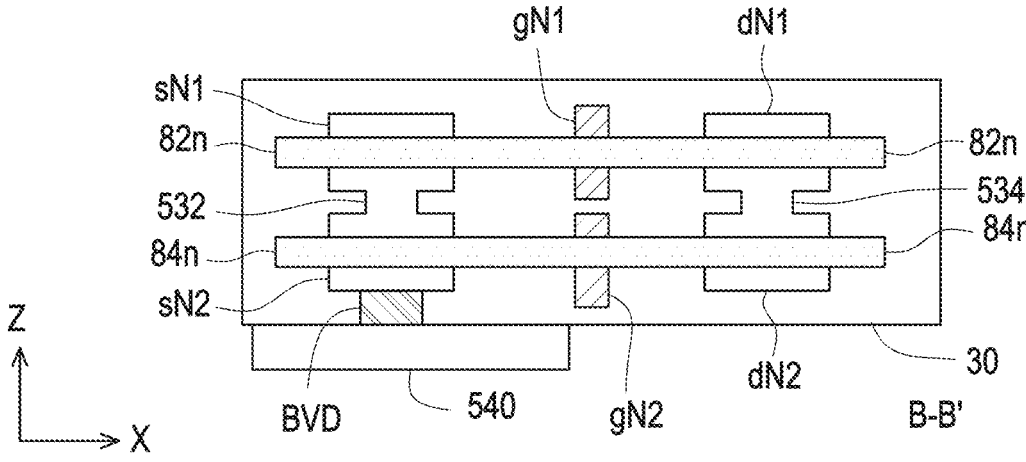
Figure 5E:
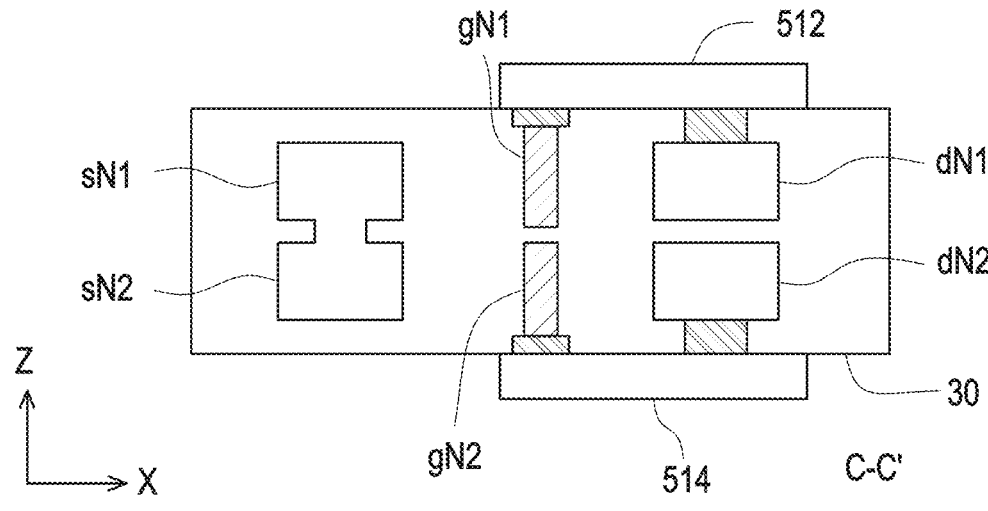

FIG. 5B is a layout diagram of the header switch 500 in FIG. 5A, in accordance with some embodiments. FIG. 5C is a cross-sectional view of the header switch 500 along a cutting plane A-A' as shown in the layout diagram of FIG. 5B, in accordance with some embodiments. FIG. 5D is a cross-sectional view of the header switch 500 along a cutting plane B-B' as shown in the layout diagram of FIG. 5B, in accordance with some embodiments. FIG. 5E is a cross-sectional view of the header switch 500 along a cutting plane C-C' as shown in the layout diagram of FIG. 5B, in accordance with some embodiments.

In FIGS. 5B-5D, the PMOS transistor TP1 in the header switch 500 is implemented with a PMOS active-region structure 80p. The NMOS transistors TN1 and TN2 in the header switch 500 are correspondingly implemented with NMOS active-region structures 82n and 84n. Each of PMOS active-region structure 80p and NMOS active-region structures 82n and 84n extends in the X-direction. The NMOS active-region structure 82n is stacked over the NMOS active-region structure 84n and shifted from the NMOS active-region structure 84n along the Z-direction. Each of the NMOS active-region structures 82n and 84n is at the front side of a substrate 30. A gate-conductor gP1 extending in the Y-direction intersects the PMOS active-region structure 80p at the channel region of the PMOS transistor TP1. A gate-conductor gN1 extending in the Y-direction intersects the NMOS active-region structure 82n at the channel region of the NMOS transistor TN1. A gate-conductor gN2 extending in the Y-direction intersects the NMOS active-region structure 84n at the channel region of the NMOS transistor TN2. In some embodiments, the PMOS transistors TP1 and the NMOS transistors TN1 and TN2 are nano-sheet transistors. In some embodiments, the PMOS transistors TP1 and the NMOS transistors TN1 and TN2 are nano-wire transistors.

In FIGS. 5B-5D, the terminal conductor MD intersecting the PMOS active-region structure 82p at the source region of the PMOS transistor TP1 forms the source terminal sP1 of the PMOS transistor TP1, and the terminal conductor MD intersecting the PMOS active-region structure 80p at the drain region of the PMOS transistor TP1 forms the drain terminal dP1 of the PMOS transistor TP1. The terminal conductor MD intersecting the NMOS active-region structure 82n at the source region of the NMOS transistor TN1 forms the source terminal sN1 of the NMOS transistor TN1, and the terminal conductor MD intersecting the NMOS active-region structure 82n at the drain region of the NMOS transistor TN1 forms the drain terminal dN1 of the NMOS transistor TN1. The terminal conductor BMD intersecting the NMOS active-region structure 84n at the source region of the NMOS transistor TN2 forms the source terminal sN2 of the NMOS transistor TN2, and the terminal conductor BMD intersecting the NMOS active-region structure 82n at the drain region of the NMOS transistor TN2 forms the drain terminal dN2 of the NMOS transistor TN2.

The source terminal sP1 of the PMOS transistor TP1 is connected to a front-side conductor 520 in a first front-side metal layer through a via-connector VD. The source terminal sN2 of the NMOS transistor TN2 is connected to a back-side conductor 540 in a first back-side metal layer through a via-connector BVD. The drain terminal dP1 of the PMOS transistor TP1 is connected to the drain terminal dN1 of the NMOS transistor TN1 through terminal connector 572 extending in the Y-direction. The drain terminal dN1 of the NMOS transistor TN1 is connected to the drain terminal dN2 of the NMOS transistor TN2 through an inter-terminal connector 534. The source terminal dN1 of the NMOS transistor TN1 is connected to the source terminal dN2 of the NMOS transistor TN2 through an inter-terminal connector 532. The gate terminal gN1 of the NMOS transistor TN1 and the drain terminal dN1 of the NMOS transistor TN1 are conductively connected together through a front-side conductor 512 in the first front-side metal layer. The gate terminal gN2 of the NMOS transistor TN2 and the drain terminal dN2 of the NMOS transistor TN2 are conductively connected together through a back-side conductor 514 in the first back-side metal layer.

The gate terminal of the PMOS transistor TP1 is connected to a front-side conductor 510 in the first front-side metal layer through a via-connector VG. The front-side conductor 510 is configured to receive the power control signal PG. The front-side conductor 520 is configured to receive the upper power supply voltage VCC. The back-side conductor 540 is configured as the memory power line 40 which is connected to the memory circuit 50.

FIG. 6 is a flowchart of a method 600 of manufacturing an integrated circuit (IC) having CFET devices, in accordance with some embodiments. It is understood that additional operations may be performed before, during, and/or after the method 600 depicted in FIG. 6, and that some other processes may only be briefly described herein.

In operation 610 of method 600, a first-type active-region structure extending in the X-direction is fabricated on a substrate 30. Then, in operations 620 and 630 of method 600, a first gate-conductor extending in a Y-direction is formed as a gate-terminal of a first transistor, and a first terminal conductor extending in the Y-direction is formed as a drain terminal of the first transistor. In the example as shown in FIGS. 2A-2D, the NMOS active-region structure 80n extending in the X-direction is fabricated on a substrate 30. A gate-conductor extending in the Y-direction is formed as a gate-terminal gN1 of an NMOS transistor TN1, and a first terminal conductor extending in the Y-direction is formed as a drain terminal dN1 of the NMOS transistor TN1.

In operation 640 of method 600, a second-type active-region structure stacked over the first-type active-region structure is fabricated. The second-type active-region structure also extends in the X-direction. Then, in operations 650 and 660 of method 600, a second gate-conductor extending in the Y-direction is formed as a gate-terminal of a second transistor, and a second terminal conductor extending in the Y-direction is formed as a drain terminal of the second transistor. In the example as shown in FIGS. 2A-2D, the PMOS active-region structure 80p extending in the X-direction stacked over the NMOS active-region structure 80n is fabricated. A gate-conductor extending in the Y-direction is formed as a gate-terminal gP1 of an PMOS transistor TP1, and a first terminal conductor extending in the Y-direction is formed as a drain terminal dP1 of the PMOS transistor TP1. After operations 650 and 660, the process proceeds to operations 670, 680, and 690.

In operation 670 of method 600, a front-side conductor in a front-side metal layer is fabricated, and a source terminal of the second-type transistor is connected to the front-side conductor. In the example as shown in FIGS. 2A-2D, a front-side conductor 220 in a front-side metal layer is fabricated, and a source terminal sP1 of the PMOS transistor TP1 is connected to the front-side conductor 220 through a via-connector VD.

In operations 680 and 690 of method 600, at least one back-side conductor in a back-side metal layer is fabricated at a back side of the substrate 30, the first terminal conductor is connected to the first gate-conductor through one back-side conductor, and a memory power line that is connected to a source terminal of the first-type transistor. In the example as shown in FIGS. 2A-2D, back-side conductors 214 and 240 in a back-side metal layer is fabricated at a back side of the substrate 30, the drain terminal dN1 of the NMOS transistor TN1 is connected to the gate-conductor gN1 through the back-side conductor 214, and the back-side conductor 240 is connected to the source terminal sN1 of the NMOS transistor TN1. The back-side conductor 240 functions as a memory power line which is also connected to one or more memory circuit such as the memory circuit 50.

Figure 7:
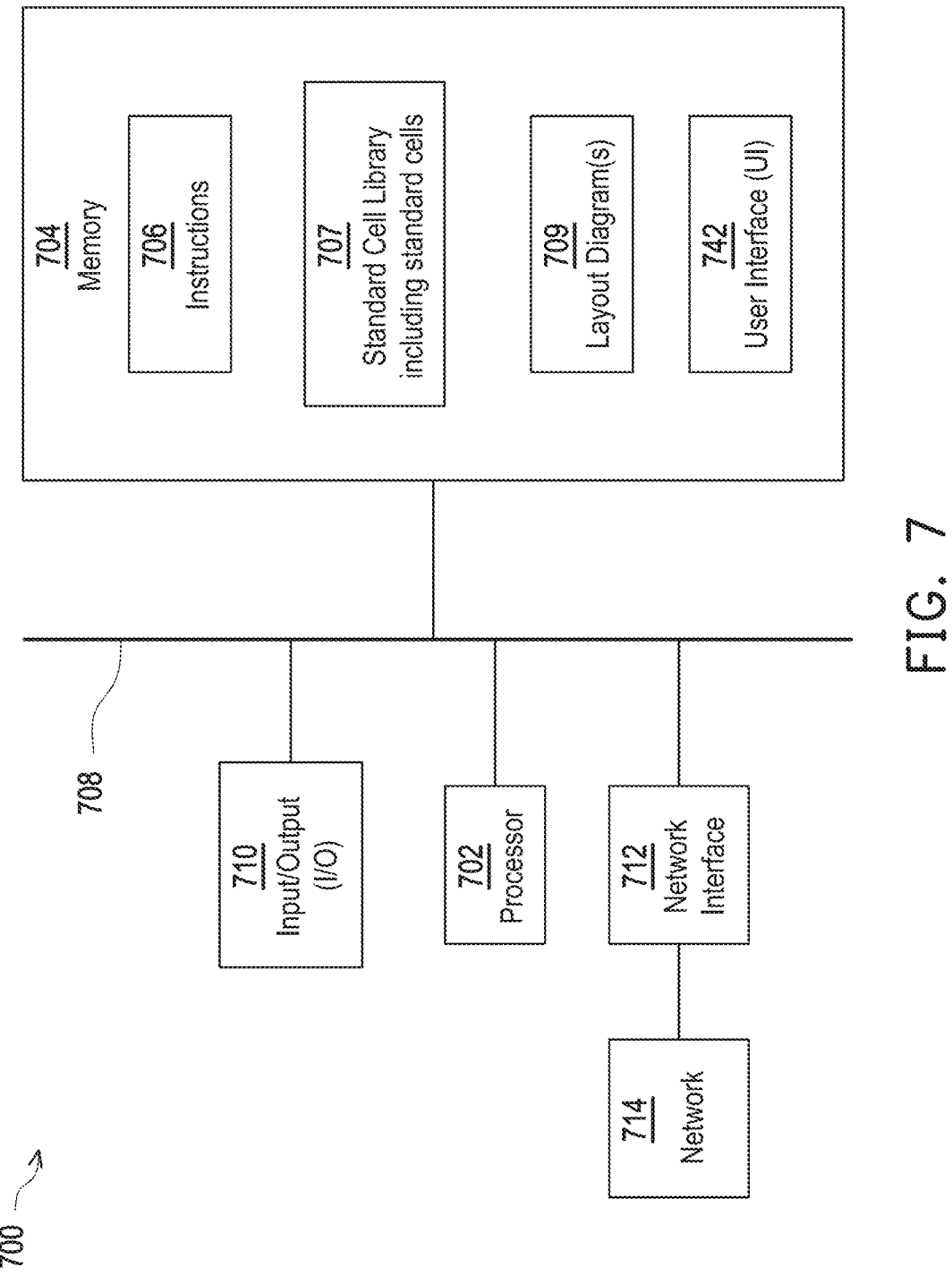
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an automatic placement and routing (APR) system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein. In one or more embodiments, storage medium 704 stores one or more layout diagrams 709 corresponding to one or more layouts disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a user interface (UI) through I/O interface 710. The information is stored in computer-readable medium 704 as UI 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
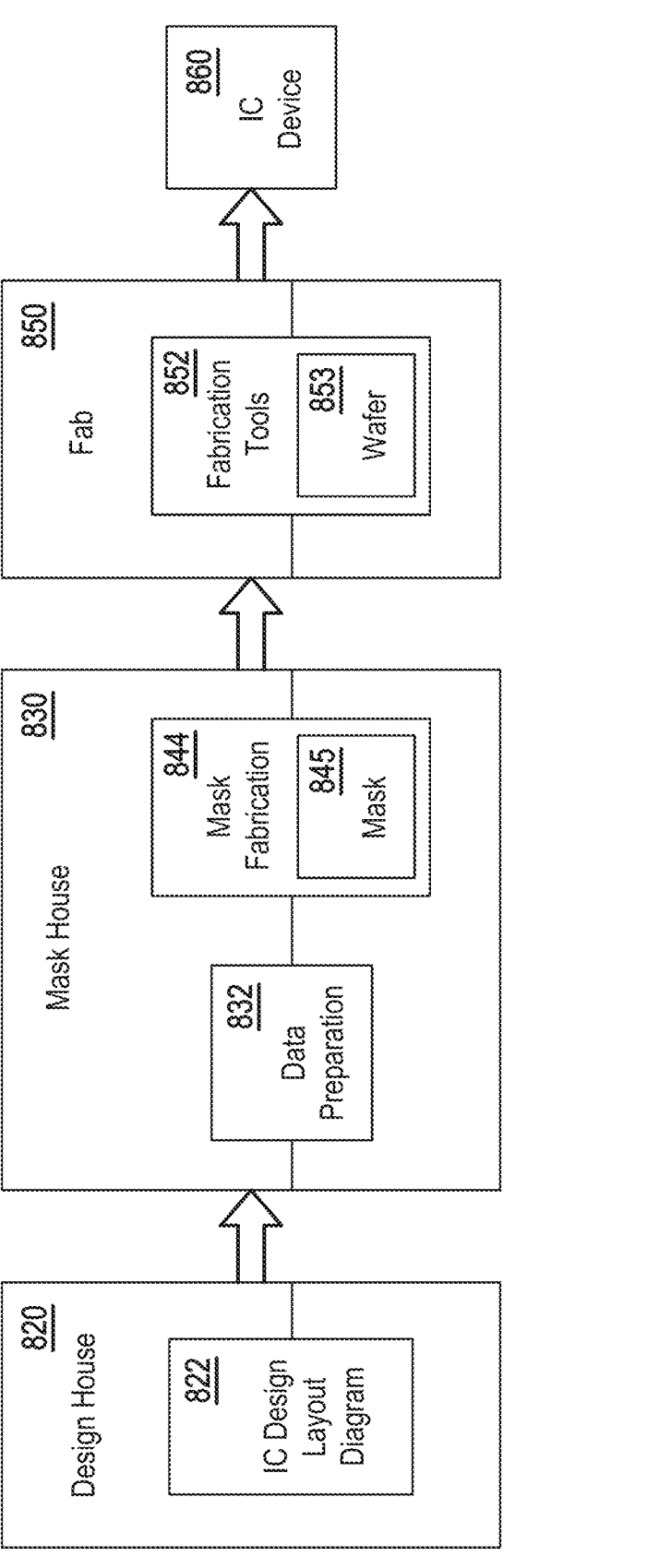
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator (fab) 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for photolithographic implementation effects during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

An aspect of the present disclosure relates to an integrated circuit device. The integrated circuit device includes a first transistor having a first-type channel and a second transistor having a second-type channel at a front side of a substrate. The first transistor is stacked over the second transistor. The integrated circuit device also includes a power line connected to a source terminal of the first transistor. The first transistor has a gate terminal configured to receive a control signal and has a drain terminal connected to both a gate terminal and a drain terminal of the second transistor. The integrated circuit device further includes a memory power line connected to a source terminal of the second transistor, and a memory circuit configured to receive a supply voltage from the memory power line.

Another aspect of the present disclosure relates to an integrated circuit device. The integrated circuit device includes a substrate, a first-type active-region structure extending in a first direction, and a second-type active-region structure extending in the first direction and stacked over the first-type active-region structure at a front side of the substrate. The integrated circuit device also includes a first gate-conductor extending in a second direction perpendicular to the first direction which intersects the first-type active-region structure at a channel region of a first first-type transistor, and a first terminal conductor extending in the second direction which intersects the first-type active-region structure at a drain region of the first first-type transistor. The second-type active-region structure is shifted from the first-type active-region structure along a third direction perpendicular to both the first direction and the second direction. The integrated circuit device further includes a second gate-conductor extending in the second direction which intersects the second-type active-region structure at a channel region of a first second-type transistor, and a second terminal conductor extending in the second direction which intersects the second-type active-region structure at a drain region of the first second-type transistor. The second terminal conductor is conductively connected to the second gate-conductor, and the second terminal conductor is conductively connected to the first terminal conductor intersecting the first-type active-region structure. The integrated circuit device still includes a memory power line connected to a source terminal of the first second transistor, and a memory circuit configured to receive a supply voltage from the memory power line.

Still another aspect of the present disclosure relates to a method. The method includes fabricating a first-type active-region structure extending in a first direction on a substrate, forming a first gate-conductor extending in a second direction that is perpendicular to the first direction, and forming a first terminal conductor extending in the second direction. The first gate-conductor intersects the first-type active-region structure at a channel region of a first-type transistor. The first terminal conductor intersects the first-type active-region structure at a drain region of the first-type transistor. The method also includes fabricating a second-type active-region structure extending in the first direction and stacked over the first-type active-region structure at a front side of the substrate. The second-type active-region structure is shifted from the first-type active-region structure along a third direction perpendicular to both the first direction and the second direction. The method further includes forming a second gate-conductor extending in the second direction, and forming a second terminal conductor extending in the second direction. The second gate-conductor intersects the second-type active-region structure at a channel region of a second-type transistor. The second terminal conductor intersects the second-type active-region structure at a drain region of the second-type transistor. The second terminal conductor is conductively connected to the first terminal conductor. The method still includes fabricating a memory power line that is connected to a source terminal of the second transistor.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit device comprising:

a substrate;

a first transistor having a first-type channel and a second transistor having a second-type channel at a front side of the substrate, wherein the first transistor is stacked over the second transistor;

a power line connected to a source terminal of the first transistor, the first transistor having a gate terminal configured to receive a control signal and having a drain terminal connected to both a gate terminal and a drain terminal of the second transistor;

a memory power line connected to a source terminal of the second transistor;

a third transistor having either a first-type channel or a second-type channel connected between the drain terminal of the first transistor and the memory power line, wherein the third transistor has a gate terminal connected to a drain terminal thereof; and a memory circuit configured to receive a supply voltage from the memory power line.

2. The integrated circuit device of claim 1, wherein the third transistor has the first-type channel, and wherein the third transistor has a source terminal connected to the drain terminal of the first transistor.

3. The integrated circuit device of claim 1, wherein the third transistor has the second-type channel, and wherein the third transistor has a source terminal connected to the memory power line.

4. The integrated circuit device of claim 1, further comprising:

a front-side conductor in a front-side metal layer above the first transistor and the second transistor; and a back-side conductor in a back-side metal layer at a back side of the substrate.

5. An integrated circuit device comprising:

a substrate;

a first-type active-region structure extending in a first direction;

a first gate-conductor, extending in a second direction perpendicular to the first direction, intersecting the first-type active-region structure at a channel region of a first first-type transistor;

a first terminal conductor, extending in the second direction, intersecting the first-type active-region structure at a drain region of the first first-type transistor;

a second-type active-region structure extending in the first direction and stacked over the first-type active-region structure at a front side of the substrate, the second-type active-region structure being shifted from the first-type active-region structure along a third direction perpendicular to both the first direction and the second direction;

a second gate-conductor, extending in the second direction, intersecting the second-type active-region structure at a channel region of a first second-type transistor;

a second terminal conductor, extending in the second direction, intersecting the second-type active-region structure at a drain region of the first second-type transistor, wherein the second terminal conductor is conductively connected to the second gate-conductor, and wherein the second terminal conductor is conductively connected to the first terminal conductor intersecting the first-type active-region structure;

a memory power line connected to a source terminal of the first second-type transistor;

a third gate-conductor, extending in the second direction, intersecting the second-type active-region structure at a channel region of a second second-type transistor, and wherein the second second-type transistor has a source terminal conductively connected to the memory power line;

a third terminal conductor, extending in the second direction, intersecting the second-type active-region structure at a drain region of the second second-type transistor, wherein the third terminal conductor is conductively connected to the third gate-conductor, and wherein the third terminal conductor is conductively connected to the first terminal conductor intersecting the first-type active-region structure; and a memory circuit configured to receive a supply voltage from the memory power line.

6. The integrated circuit device of claim 5, further comprising:

a front-side conductor in a front-side metal layer above the first-type active-region structure and the second-type active-region structure; and a third terminal conductor, extending in the second direction, intersecting the first-type active-region structure at a source region of the first first-type transistor, wherein the third terminal conductor is conductively connected to the front-side conductor.

7. The integrated circuit device of claim 5, further comprising:

a back-side conductor in a back-side metal layer at a back side of the substrate; and a third terminal conductor, extending in the second direction, intersecting the second-type active-region structure at a source region of the first second-type transistor, wherein the third terminal conductor is conductively connected to the back-side conductor.

8. The integrated circuit device of claim 5, further comprising:

a back-side conductor in a back-side metal layer at a back side of the substrate, and wherein the second terminal conductor is conductively connected to the second gate-conductor through the back-side conductor.

9. The integrated circuit device of claim 5, wherein a source terminal of the first first-type transistor is configured to be maintained at an upper power supply voltage.

10. The integrated circuit device of claim 5, wherein the first gate-conductor is configured to receive a power control signal.

11. The integrated circuit device of claim 5, further comprising:

a back-side conductor in a back-side metal layer at a back side of the substrate, and wherein the third terminal conductor is conductively connected to the third gate-conductor through the back-side conductor.

12. The integrated circuit device of claim 5, wherein the first-type active-region structure is a PMOS active-region structure, and the second-type active-region structure is a NMOS active-region structure.

13. The integrated circuit device of claim 5, wherein the first-type active-region structure is a NMOS active-region structure, and the second-type active-region structure is a PMOS active-region structure.

14. An integrated circuit device comprising:

a substrate;

a first-type active-region structure extending in a first direction;

a first gate-conductor, extending in a second direction perpendicular to the first direction, intersecting the first-type active-region structure at a channel region of a first first-type transistor;

a first terminal conductor, extending in the second direction, intersecting the first-type active-region structure at a drain region of the first first-type transistor;

a second-type active-region structure extending in the first direction and stacked over the first-type active-region structure at a front side of the substrate, the second-type active-region structure being shifted from the first-type active-region structure along a third direction perpendicular to both the first direction and the second direction;

a second gate-conductor, extending in the second direction, intersecting the second-type active-region structure at a channel region of a first second-type transistor;

a second terminal conductor, extending in the second direction, intersecting the second-type active-region structure at a drain region of the first second-type transistor, wherein the second terminal conductor is conductively connected to the second gate-conductor, and wherein the second terminal conductor is conductively connected to the first terminal conductor intersecting the first-type active-region structure;

a memory power line connected to a source terminal of the first second-type transistor;

a third gate-conductor, extending in the second direction, intersecting the first-type active-region structure at a channel region of a second first-type transistor, and wherein the second first-type transistor has a source terminal conductively connected to the first terminal conductor intersecting the first-type active-region structure;

a third terminal conductor, extending in the second direction, intersecting the first-type active-region structure at a drain region of the second first-type transistor, wherein the third terminal conductor is conductively connected to the third gate-conductor, and wherein the third terminal conductor is conductively connected to the memory power line; and a memory circuit configured to receive a supply voltage from the memory power line.

15. The integrated circuit device of claim 14, further comprising:

a front-side conductor in a front-side metal layer above the first-type active-region structure and the second-type active-region structure, and wherein the third terminal conductor is conductively connected to the third gate-conductor through the front-side conductor.

16. The integrated circuit device of claim 14, further comprising:

a front-side conductor in a front-side metal layer above the first-type active-region structure and the second-type active-region structure; and a fourth terminal conductor, extending in the second direction, intersecting the first-type active-region structure at a source region of the first first-type transistor, wherein the fourth terminal conductor is conductively connected to the front-side conductor.

17. The integrated circuit device of claim 14, further comprising:

a back-side conductor in a back-side metal layer at a back side of the substrate; and a fourth terminal conductor, extending in the second direction, intersecting the second-type active-region structure at a source region of the first second-type transistor, wherein the fourth terminal conductor is conductively connected to the back-side conductor.

18. The integrated circuit device of claim 14, further comprising:

a back-side conductor in a back-side metal layer at a back side of the substrate, and wherein the second terminal conductor is conductively connected to the second gate-conductor through the back-side conductor.

19. The integrated circuit device of claim 14, wherein a source terminal of the first first-type transistor is configured to be maintained at an upper power supply voltage.

20. The integrated circuit device of claim 14, wherein the first gate-conductor is configured to receive a power control signal.

* * * * *